United States Patent
Thallner

(10) Patent No.: US 10,276,409 B2
(45) Date of Patent: Apr. 30, 2019

(54) SAMPLE HOLDER, DEVICE AND METHOD FOR DETACHING OF A FIRST SUBSTRATE

(71) Applicant: Erich Thallner, St. Florian (AT)

(72) Inventor: Erich Thallner, St. Florian (AT)

( * ) Notice: Subject to any disclaimer, the term of this patent is extended or adjusted under 35 U.S.C. 154(b) by 2 days.

(21) Appl. No.: 15/318,790

(22) PCT Filed: Jun. 27, 2014

(86) PCT No.: PCT/EP2014/063687
§ 371 (c)(1),
(2) Date: Dec. 14, 2016

(87) PCT Pub. No.: WO2015/197132
PCT Pub. Date: Dec. 30, 2015

(65) Prior Publication Data
US 2017/0133243 A1 May 11, 2017

(51) Int. Cl.
*H01L 21/687* (2006.01)
*B32B 43/00* (2006.01)
(Continued)

(52) U.S. Cl.
CPC ........ *H01L 21/67092* (2013.01); *B32B 37/08* (2013.01); *B32B 43/006* (2013.01);
(Continued)

(58) Field of Classification Search
CPC . H01L 2221/68381; H01L 2221/68386; Y10T 156/1189; Y10T 156/1972; Y10S 156/93; Y10S 156/941
See application file for complete search history.

(56) References Cited

U.S. PATENT DOCUMENTS 2,878,142 A * 3/1959 Bohaty ............... C09J 7/50
428/337
4,600,635 A * 7/1986 Wiercinski ............ B32B 11/04
428/220
(Continued)

FOREIGN PATENT DOCUMENTS

EP 0241749 A1 * 10/1987 .............. B08B 3/12
EP 1523030 A2 4/2005 ............ H01L 21/00
(Continued)

OTHER PUBLICATIONS

International Search Report from corresponding International Patent Application No. PCT/EP2014/063687, dated Aug. 25, 2014.

*Primary Examiner* — Mark A Osele
(74) *Attorney, Agent, or Firm* — Kusner & Jaffe

(57) ABSTRACT

A method and device for detaching a first substrate, which is connected to a second substrate by an interconnect layer, from the second substrate by embrittlement of the interconnect layer. A method for bonding of a first substrate to a second substrate with an interconnect layer which can be embrittled by cooling. A use of a material which can be embrittled for producing an interconnect layer between first and second substrates for forming a substrate stack. A substrate stack, formed from a first substrate, a second substrate and an interconnect layer located therebetween, the interconnect layer formed from a material which can be embrittled. A wafer chuck for holding a first substrate when the first substrate is being detached from a second substrate with fixing means which can be activated by lowering the temperature.

15 Claims, 5 Drawing Sheets

(51) Int. Cl.
*H01L 21/67* (2006.01)
*H01L 21/683* (2006.01)
*B32B 37/08* (2006.01)

(52) U.S. Cl.
CPC .... *H01L 21/67103* (2013.01); *H01L 21/6835* (2013.01); *H01L 21/68714* (2013.01); *B32B 2309/105* (2013.01); *B32B 2457/00* (2013.01); *H01L 21/6836* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01); *Y10S 156/93* (2013.01); *Y10S 156/941* (2013.01); *Y10T 156/1153* (2015.01); *Y10T 156/1189* (2015.01); *Y10T 156/1911* (2015.01); *Y10T 156/1972* (2015.01)

(56) References Cited

U.S. PATENT DOCUMENTS

| | | | | |
|---|---|---|---|---|
| 4,608,109 | A * | 8/1986 | Pook | H01G 7/023 156/247 |
| 5,448,817 | A * | 9/1995 | Waldsmith | H01L 21/4882 156/709 |
| 6,682,990 | B1 * | 1/2004 | Iwane | H01L 21/67207 136/244 |
| 7,384,811 | B2 | 6/2008 | Miyamoto et al. | |
| 7,892,385 | B2 * | 2/2011 | Baek | B32B 37/12 156/230 |
| 8,376,017 | B2 * | 2/2013 | Lee | B32B 38/10 156/711 |
| 8,741,089 | B2 * | 6/2014 | Tsuchida | G06F 3/045 156/247 |
| 8,883,565 | B2 * | 11/2014 | Vaupel | H01L 21/78 257/527 |
| 8,950,459 | B2 | 2/2015 | George et al. | |
| 2001/0055854 | A1 | 12/2001 | Nishida et al. | |
| 2010/0263794 | A1 | 10/2010 | George et al. | 156/344 |
| 2011/0014354 | A1 * | 1/2011 | Graham | C09J 163/00 427/8 |
| 2013/0068379 | A1 | 3/2013 | Tsuchida et al. | |
| 2017/0106644 | A1 * | 4/2017 | Zhao | B32B 43/006 |

FOREIGN PATENT DOCUMENTS

| | | | | |
|---|---|---|---|---|
| TW | 200520083 | 6/2005 | | |
| TW | 201335981 A1 | 9/2013 | | |
| WO | WO 2012/139627 A1 | 10/2012 | | H01L 21/67 |
| WO | WO 2013/063603 A2 | 5/2013 | | H01L 21/02 |

* cited by examiner

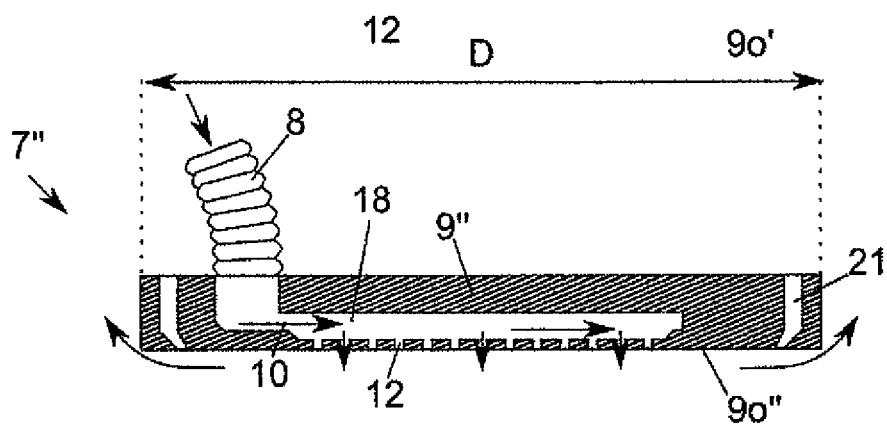
Fig. 4
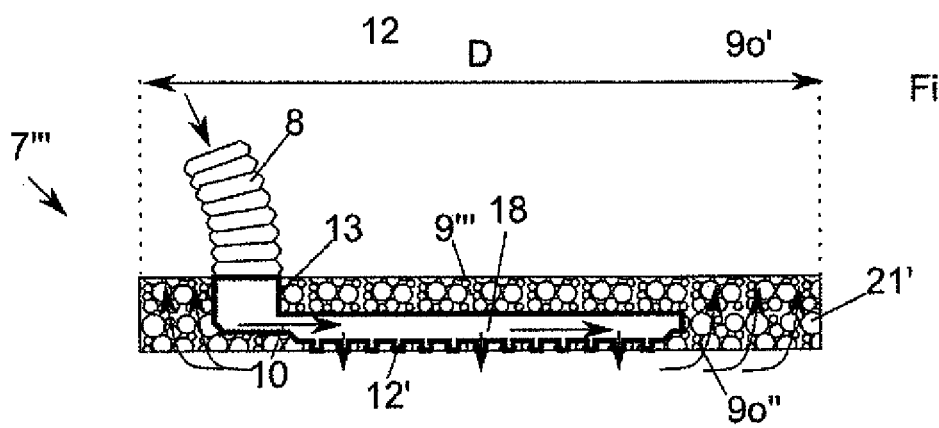
Fig. 5
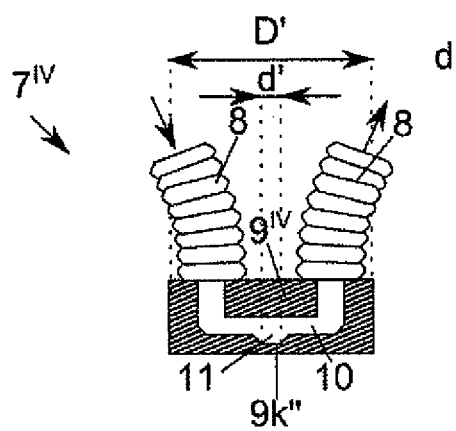
Fig. 6
Fig. 7
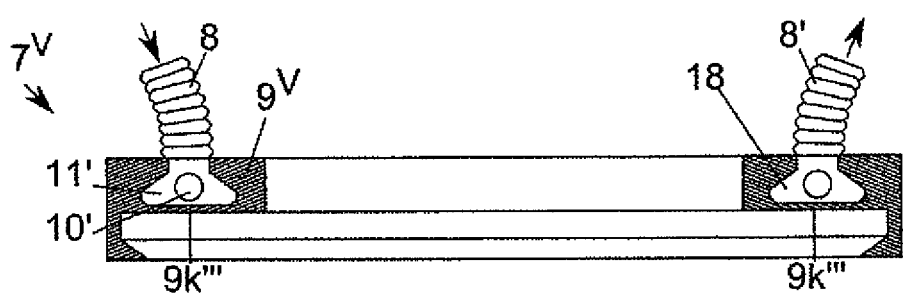

SAMPLE HOLDER, DEVICE AND METHOD FOR DETACHING OF A FIRST SUBSTRATE

FIELD OF THE INVENTION

The invention relates to a method for detaching a substrate, a device for detaching a substrate, a method for bonding a substrate, a use of a material for producing an interconnect layer, a substrate stack formed from a pair of substrates, and an interconnect layer and a substrate mount for holding a substrate.

BACKGROUND OF THE INVENTION

In semiconductor technology, substrates are generally back-thinned to reduce the dimension of the components which are being formed. One of the most frequent reasons for the use of back-thinning is to produce electrically conductive interconnections through the substrate. These lines are called through silicon via (TSVs) in particular due to their frequent use in silicon substrates. Since the industrially produced substrates, in particular wafers, have a thickness of more than 500 µm, and the TSVs however only have a length of roughly 100 µm, it is necessary to remove the residual parts of the substrate. At the end of the back-thinning process a function wafer with a thickness as small as possible will result. The thickness depends on the technical and electrical properties.

The product substrates are fixed on carrier substrates so that they are stabilized during and mainly after the back-thinning process. Mainly semiconductor substrates or glass substrates are used as carrier substrates.

The product substrates are subjected to various processes after bonding to the carrier substrate. In particular, functional units, for example MEMs, microchips, memory units etc. are formed on the product substrates.

After back-thinning and other processes, the product substrate must be detached from the carrier substrate in order to be able to be further processed.

The process of fixing is called bonding. If the fixing is limited in time, it is temporary bonding. For temporary bonding various materials are used which enable fixing of the two substrates during the different process steps, but on the other hand allow a separation of the substrates with certain chemical and physical effects. The cement bonds between the product substrate and carrier substrate can for example be chemically broken. Another method is the separation of the substrates by the action of heat and the application of a shearing and/or normal force. A further method includes destroying the cement by electromagnetic radiation, especially by UV light. To do this, at least one of the two substrates must be transparent to the UV light.

All these hitherto known methods have major defects which can lead to an at least partial adverse effect on the properties of the interconnect layer and/or the substrates or components which are located thereon.

In debonding/detachment of the carrier substrate from the product substrate, a host of critical factors must be considered and a top priority includes exposing the brittle product wafer which is very expensive due to preprocessing to as little stress as possible and not damaging it. The detachment of the first substrate should on the other hand proceed economically and quickly with as little energy expenditure as possible. In a plurality of known detachment processes it is necessary, especially for dissolving the adhesion properties of the adhesion layer between the wafers, to heat the stack composed of the carrier wafer and structure wafer/product wafer to a temperature which is specific to the cement.

SUMMARY OF THE INVENTION

The object of this invention is to develop the generic devices and methods for detachment from first substrates such that careful and prompt detachment is enabled. At the same time the energy consumption will be reduced.

This object is achieved with the features of the independent claim(s). Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

The basic idea of this invention is to enable or effect a detachment of the substrates by cooling and/or embrittlement of an interconnect layer and/or cooling of the substrates and/or of a substrate stack which has been formed from the interconnect layer and the substrates.

The invention describes in particular a method and a system/device for detaching/debonding of two substrates, in particular wafers, by cooling by means of a cooling agent. In particular the invention is based on the idea of using an interconnect layer (in particular a cement) for bonding of two substrates, which layer embrittles at low temperatures, especially below room temperature.

Here in particular the mechanical stability and/or the adhesion action of the interconnect layer are reduced.

Instead of heating for reduction of viscosity, mechanical stability and/or adhesion properties, in the method of the invention in particular the entire substrate stack is cooled in order to embrittle the interconnect layer. The embrittlement takes place such that a separation of the two substrates with relatively little mechanical force becomes possible. The mechanical force, depending on the respective embodiment of the invention, can be applied as shear force or as normal force.

The normal forces can be in particular a point force, a line force or an area force. To separate two surfaces the energy per unit of area, hereinafter called the energy density, which is at least necessary to separate two bodies, is specified. The energy density between the two substrates is in particular less than 2.5 $J/m^2$, preferably less than 2.0 $J/m^2$, still more preferably less than 1.5 $J/m^2$, most preferably less than 1.0 $J/m^2$, most preferably of all less than 0.5 $J/m^2$.

In particular the separation takes place automatically by embrittlement and/or by the internal stress which arises during cooling in the cooling process, therefore preferably dictated solely by the cooling. The cement is transferred in particular not into a more viscose state, but by furnishing cold, into a hardened, brittle state.

In other words, the invention includes in particular in the embrittlement of a material of the interconnect layer, in particular of a cement, even more preferably a bonding adhesive, for reducing the mechanical stability and/or the adhesion properties of the interconnect layer. The invention thus describes methods and systems for effecting the embrittlement.

The invention solves the long-standing problem of debonding at elevated temperatures. The diffusion coefficient of a component in a medium, in particular the diffusion coefficient of a metal atom in a metal matrix or semimetal matrix, is an explicit function of temperature. Elevated temperatures mean an increased diffusion property of the species in the medium. The diffusion therefore generally proceeds more quickly, the higher the temperature, and more slowly, the lower the temperature. Product substrates very often have already doped semiconductor components, especially microchips or memory chips. An elevated temperature load during a debonding process can lead to unwanted diffusion of the doping elements. The substrate stack is in particular not heated, but cooled by the embodiments and methods of the invention which are described below. With them a possible unwanted diffusion of doping elements is greatly slowed.

Another advantage of the invention includes an increased debonding rate. Two, in particular blanket-bonded substrates, can be separated from one another within a few seconds by the process of the invention. The reduction of the debonding time results in an increase of the throughput and thus in higher economic efficiency.

According to one advantageous embodiment of the invention cooling units are made as cooling agents for cooling of the substrate mount/wafer chuck for accommodating and holding the substrate/substrates. They have in particular corresponding fixing elements, in particular vacuum lines. The cooling unit/units and fixing elements is/are locally separated from one another and/or can be moved independently. In particular feed inlets and drains for a cooling agent are made able to be rerouted, preferably as hose or flexible tube construction.

Embodiments of the invention describe devices/systems and methods for cooling a substrate stack and in this way enabling careful stripping. Cooling of the substrate stack (preferably indirectly, therefore without direct contact with the interconnect layer) cools the interconnect layer, in particular the cement, preferably a bonding adhesive.

One idea of the invention includes in particular in using a material for the interconnect layer which at room temperature or slightly elevated temperature is suitable for bonding of the substrates, at lower temperature embrittles at least partially, in particular completely, and thus either loses its adhesion properties to the surfaces of the substrates or can be at least separated along its volume, so that separation of the two substrates of the substrate stack from one another can take place.

Substrate Stack

The substrate stack is comprised of at least two substrates which are/have been bonded to one another by an interconnect layer, in particular a cement. Substrate stacks with more than two substrates are also conceivable, two substrates always being joined to one another using a cement. Hereinafter for the sake of simplicity, substrate stacks with two substrates are treated. The substrate stack can be fastened on a tape which has been laminated in particular onto a frame. This embodiment is used in particular for fixing of already back-thinned substrates (product substrates).

Interconnect Layer (System), in Particular Cement Systems

According to the invention any interconnect layer which is suitable for bonding of two substrates and which embrittles below a critical temperature can be used.

Cements which are preferred can be single-layer cements, multilayer cements or cements with structured layers. The material of each layer can be a single-component or multicomponent system.

The thickness of each layer of the interconnect layer is in particular less than 1 mm, preferably less than 500 µm, still more preferably less than 100 µm, most preferably less than 1 µm, most preferably of all less than 10 nm.

The thickness of the interconnect layer which is the sum of the layer thicknesses of individual layers is in particular less than 1 mm, preferably less than 500 µm, still more preferably less than 100 µm, most preferably less than 1 µm, most preferably of all less than 10 nm. In substrates with a surface topography the sum of the layer thicknesses is at least as great as the highest topography, in particular greater by at least 1 nm, still more preferably greater by at least 10 nm, most preferably greater by at least 100 nm, most preferably of all greater by at least 1 µm, still more preferably greater by at least 10 µm.

In a first embodiment of the invention the interconnect layer is a single-component system. In particular materials are used which are based on one of the following components:
  silicones and/or
  plastics, in particular
    thermoplastics,
    duroplastics,
    elastomers,
  wax.

The adhesive can be assigned for example to one of the following classes . . .
  Physically setting adhesives, in particular
    contact adhesives
    hot melt adhesives
    solvent adhesives or dispersion adhesives of polymers which are present in the
    final state,
    dispersion adhesives
    water-activated or solvent-activated adhesives
    plastiols
  Chemically hardening adhesives, in particular
    polymerization adhesives, in particular
      acrylate adhesives, in particular
        methylmethacrylate adhesives
        cyanoacrylate adhesives
      unsaturated polyesters
    polycondensation adhesives, in particular
      phenol-formaldehyde resin adhesives
      silicones
      silane-binding polymer adhesives,
      polyimide adhesives
      polysulfide adhesives
    polyaddition adhesives, in particular
      epoxy resin adhesives
      polyurethane adhesives
      silicones
  reactive hot-melt adhesives, in particular
    polyamides
    polyethylenes
    amorphous polyalphaolefins
    ethylene vinyl acetate copolymers
    polyester elastomers
    polyurethane elastomers
    copolyamide elastomers
    vinylpyrrolidone/vinyl acetate copolymers The cement can be preferably a cycloolefin copolymer (COC).

In a second embodiment of the invention the interconnect layer is a multicomponent bond. In particular, components are used which significantly influence the brittle failure properties. These components can be the following
  organic components, especially organic molecules, still more preferably molecules for anti-sticking layers (ASL) and/or inorganic components, especially inorganic molecules and/or metals, in particular metal ions and/or metal alloys and/or ceramics.

In a multicomponent system the component which occurs in excess in terms of quantity and/or mass is called a matrix. Components which occur in a smaller proportion in terms of quantity and/or mass are also called additives. Additives are preferably added along the entire interconnection surface of the cement. According to the invention, a locally limited addition of additives, in particular along a preferably complete peripheral contour of the interconnect layer, is also conceivable.

In a further improvement of the embodiments of the invention the interconnect layer is made as a multilayer system, each layer being either a single-component system or a multicomponent system. Each individual layer can therefore have different chemical and/or physical properties in particular with respect to the layer which is adjacent at the time. Not each layer need have adhesive properties.

In one preferred embodiment at least one of the layers is made without or with little adhesive action which is used in particular solely for embrittlement or separation of the layer system and thus of the two substrates from one another.

According to one further improvement of the embodiment of the invention, at least one of the layers, in particular in a multilayer system, is made structured. Structuring takes place in particular by photolithograhic and/or embossing lithographic processes. The structuring allows the production of a composite layer which is comprised of different materials. This composite layer has in particular macroscopically homogenous and/or isotropic properties, and/or is microscopically nonhomogeneous and/or anisotropic.

The dimensions of the structures which have been produced in particular by photolithography and/or embossing lithography are especially smaller than 100 μm, preferably smaller than 50 μm, still more preferably smaller than 1 μm, most preferably smaller than 100 nm, most preferably of all smaller than 10 nm.

Cooling Agent, in Particular Cooling Fluid

The cooling agent for cooling of the interconnect layer is in particular a cooling fluid which is preferably a liquid mixture, a liquid, a gas mixture, a gas and/or a liquid-gas mixture. Preferably it is a liquid or a gas.

The cooling agent, especially cooling fluid, is used to absorb and remove the heat of the interconnect layer, in particular of the substrate stack and optionally of the more immediate vicinity of the substrate stack. In this way the cooling of the interconnect layer takes place.

Theoretically, bodies can be cooled to a temperature of roughly 0 K (−273.15° C.). Such low temperatures however are only reached in laboratories which have been set up specially for this purpose and by complex apparatus. Technical low temperatures which can be reached are in particular in the vicinity of the boiling point of liquid helium and/or preferably of liquid nitrogen. The boiling point of helium is roughly 4.15 K (−269.00° C.), the boiling point of nitrogen is roughly 77 K (−196.15° C.).

In a first extension of the invention the cooling fluid is a liquid. The boiling point of the cooling fluid used is especially less than 0° C., preferably less than −50° C., still more preferably less than −100° C., most preferably less than −150° C., most preferably of all less than −200° C. The liquified gases helium and/or nitrogen which are preferably used as the cooling fluid are moreover inert, not flammable or ignitable, and less reactive. Protective devices to prevent suffocation can preferably be set up in particular in a closed cluster system. Furthermore, according to one advantageous embodiment, by installing oxygen sensors the displacement of oxygen by corresponding gases can be measured.

In a second and preferred extension of the invention the cooling fluid is a gas. The gas is used for cooling in a precooled state, in particular not compressed or only slightly compressed. The pressure of the gas is in particular less than 5 bar, preferably less than 3 bar, still more preferably less than or equal to 1 bar.

In one especially preferred alternative embodiment clean air from the environment is compressed by compressors to more than 20 bar, in particular more than 50 bar, still more preferably more than 100 bar, most preferably more than 150 bar, most preferably of all more than 200 bar. By isenthalpic expansion of the air to a pressure of less than 100 bar, in particular less than 50 bar, still more preferably less than 25 bar, most preferably less than 10 bar, most preferably of all less than 5 bar a temperature drop of several degrees Celsius is caused which is used for the cooling of the interconnect layer. In particular, by this isenthalpic expansion a temperature decrease of more than 5° C., especially more than 10° C., still more preferably more than 25° C., most preferably more than 35° C., most preferably of all more than 45° C., is achieved. The temperature drop causes in particular at least in part, preferably predominantly, still more preferably completely, the effect of embrittlement of the correspondingly selected interconnect layer which is designed in terms of material at least in one layer for the corresponding temperature range.

In another, in particular preferred embodiment the cooling fluid is used for cyclic, therefore repeated cooling. The interconnect layer is cooled and heated more than once, preferably more than 5 times, still more preferably more than 10 times, most preferably more than 15 times, most preferably of all more than 20 times. The temperature of the interconnect layer changes between temperatures above and below the critical temperature. The interconnect layer can be heated with a hot fluid, especially a heating gas and/or a heating liquid.

In a development of the embodiments of the invention the cooling fluid and the heating fluid are available in two separate chambers, between which the substrate stack (and thus the interconnect layer) can be transferred in order to cause a very rapid temperature change.

According to the invention, in particular a cooling fluid is chosen whose specific heat capacity is as large as possible in order to promote the storage of energy in the form of heat. The specific heat capacity is preferably between 0.0 kJ/(kg*K) and 20 kJ/(kg*K), preferably between 0.5 kJ/(kg*K) and 20 kJ/(kg*K), still more preferably between 1.0 kJ/(kg*K) and 20 kJ/(kg*K), most preferably between 10 kJ/(kg*K) and 20 kJ/(kg*K), most preferably of all between 15 kJ/(kg*K) and 20 kJ/(kg*K).

According to the invention, in particular a cooling fluid is chosen whose thermal conductivity is as large as possible in order to ensure the prompt removal of heat along the route of the cooling fluid. The thermal conductivity is preferably between 0.01 W/(m*K) and 10 W/(m*K), preferably between 0.05 W/(m*K) and 10 W/(m*K), still more preferably between 0.1 W/(m*K) and 10 W/(m*K), most preferably of all between 0.5 W/(m*K) and 10 W/(m*K).

Embrittlement Mechanisms

One idea of the invention includes using an interconnect layer (especially a cement) which can be embrittled by external effects, in particular by lowering the temperature below a critical temperature (embrittlement temperature).

According to the invention, embrittlement is defined as any chemical and/or physical process which influences the interconnect layer of the invention such that the substrates bonded by the interconnect layer can be separated from one another with low expenditure or force or even none at all. The term "embrittlement" is therefore further interpreted as one skilled in the art would understand it. The required force for separating the substrates of the substrate stack is in particular less than 100 kN, preferably less than 10 kN, still more preferably less than 1 kN, most preferably less than 100 N, most preferably of all less than 10 N.

According to the invention, embrittlement is characterized by a decrease of ductility in the materials science and/or physical sense. The decrease of ductility and the increase of brittleness in particular for polymer materials is primarily or largely a crosslinking effect. Crosslinking is defined in particular as a preferably 3-dimensional formation of chemical, in particular covalent interconnections. The crosslinking takes place preferably between existing polymer chains and at the end of the crosslinking process leads to a 3-dimensional network, in particular a macromolecule. The higher the degree of crosslinking, the fewer separate polymer chains exist which could participate in an elastic and/or plastic deformation of the material of the interconnect layer. In a completely crosslinked polymer, especially for duromers, elastic properties are pure electrostatic phenomena which are based on the binding forces between the polymer chains which are crosslinked with one another. Effects such as entropy elasticity or stretching of polymer chains under an external tensile load are essentially not possible in duromers. Therefore these materials react in a very brittle manner, in the ideal case in an ideally brittle manner, to external mechanical loads, in particular tensile loads.

Alternatively or in addition, the embrittlement is characterized in particular by immobilization of polymer chains of the interconnect layer, in particular caused by low thermal motion at low temperatures. Due to the very low temperatures the stretching of the polymer chains, in particular due to an external tensile load, can no longer take place so efficiently since the thermal motion of the polymer chains and therefore the tendency to unfold are less. The main part of the stretching of the polymer chain should be attributable to the external tensile load so that an effect on brittleness by temperature decrease is regarded as rather small. At high temperatures an inverse effect even occurs in which the polymer chains are contracted by the supply of heat. This effect (known as entropy elasticity) is based on the tendency of the polymer chains to maximum their entropy at higher temperatures. This type of brittleness can be found mainly in elastomers and thermoplastics.

Alternatively or in addition, the embrittlement is characterized in particular by the decrease of ductility by crystallization of the polymer. Most polymers are amorphous solids. The amorphous state is a result of the relatively long polymer chains which can on the one hand branch by side groups, but also can assume different conformations around the interconnect lines of their binding axes. This powerful combination possibility yields very complexly shaped polymer chains which are linked into one another and which are aligned to one another in parallel and thus ordered only with great difficulty. The ability of a polymer chain to become part of a partially crystalline region apparently drops with complexity, i.e. with the number and/or length of its branches, with the number of conformation possibilities and the ability to change conformations. For example molecules are rotationally stiff around a double or triple bond since the superimposed π orbitals do not enable rotation. But these polymers can be at least partially crystallized. The crystallization takes place preferably by adding seed nuclei. Seed nuclei are defined as in particular solids which start crystallization in a crystallization medium, in particular in a liquid or in a solid. Seed nuclei which cause partial crystallization of the polymer can be added to the polymers. The polymerization takes place preferably below the critical temperature so that the cement crystallizes only below the critical temperature and has a corresponding brittleness. Crystallization above the critical temperature is also conceivable.

Alternatively or in addition, the embrittlement is characterized in particular by the generation of thermal stresses and when a critical stress is exceeded, accompanying thermal cracks by a thermal shock. Thermal shock is defined as the physical effect of nonuniform temperature action on a rapidly cooled body. The nonuniform temperature action in the body arises by the finite thermal conductivity of the body which provides for the heat flow not to be able to escape from the body (when cooling) and penetrate into the body (when being heated) infinitely quickly. The finite value of the thermal conductivity leads to the surface of a rapidly cooled body adjusting more promptly to the temperature of the medium surrounding it than the inner volume layers. Accordingly very strong temperature gradients arise. The temperature gradient leads to a strong gradient of the thermal elongation. The elongation differences along the gradient yield very large thermal stresses. If the thermal stresses exceed a critical stress, in particular the fracture stress of the cooled material, cracks form.

The indicated types of embrittlement in particular have an effect on the destruction of the interconnect layer by crack formation. By applying an external mechanical load, especially a tensile and/or bending stress, cracks can form in the interconnect layer which due to the brittleness of the material propagate supercritically through the interconnect layer, especially between the interconnect layer and the substrate crack and thus lead to an especially automatic separation of the interconnect layer which takes place by embrittlement. If the cracks run through the interconnect layer, residues of the interconnect layer remain on the substrate surfaces of the two substrates. In the special case that the supercritical crack growth between the interconnect layer and one of the two substrate surfaces, in quite special exceptional cases, occurs on the two substrates surfaces, especially by the cracks changing side, cement residues should be detectable mainly on one of the two substrate surfaces.

The brittleness is characterized especially as a stripping phenomenon between the interconnect layer and at least one of the substrates, caused by external effects, in particular by a temperature drop.

Alternatively or in addition, the embrittlement is characterized as a stripping phenomenon between the interconnect layer and at least one of the substrates due to different coefficients of thermal expansion of the material of the interconnect layer (or of the material of one layer of the interconnect layer) and of the substrate. If the coefficient of thermal expansion of the interconnect layer differs from the coefficient of thermal expansion of at least one of the two substrates, the interconnect layer and the substrates for themselves (inasmuch as they would be separated from one another) would experience different thermal elongations when cooled. Since the interconnect layer and the substrate are connected to one another on their surface, the layer with the larger coefficient of thermal expansion is inhibited from elongation when cooled. The inhibition of elongation can lead to a build-up of internal tensile stress. This internal tensile stress can lead to a release of the interconnect layer, especially one of the layers of the interconnect layer when a critical value is exceeded.

To the extent a thermoplastic is used as the material for the interconnect layer, the viscosity of the thermoplastic is so great that a decrease of internal stresses which occur when a critical difference of the internal stresses is exceeded is diminished solely by a fracture, in particular along the boundary surface between the interconnect layer and substrate surface. Separation (detachment) takes place.

Alternatively or in addition the embrittlement is characterized as a stripping phenomenon between the interconnect layer and at least one of the substrates which is caused by the change in volume of the interconnect layer. In particular the change of volume causes a change (preferably an increase) of the surface roughness of the interconnect layer. The interconnect layer is preferably shifted into a liquid state on at least one of the two substrates. Due to the corresponding low viscosity the cement can be optimally matched to the substrate surface which can have in particular an extremely low surface roughness. The roughness is specified either as the average roughness, the quadratic roughness or as averaged peak-to-valley height. The determined values for the average roughness, the quadratic roughness and the averaged peak-to-valley height differ especially with respect to the same measured distance or measured area, but are of the same range of magnitude. Therefore the following ranges of numerical values for the roughness should be understood either as values for the average roughness, the quadratic roughness or for the averaged peak-to-valley height. The roughness is in particular less than 100 µm, preferably less than 10 µm, still more preferably less than 1 µm, most preferably less than 100 nm, most preferably of all less than 10 nm.

It has been surprisingly ascertained that the volume decrease on the macroplane runs more or less homogeneously and isotropically, while on the microplane, especially on the surface of the interconnect layer, an inhomogeneity and/or an anisotropy can be ascertained. This inhomogeneity and/or an anisotropy is used for the interconnect layer to strongly change its volume differently at different positions. This yields a surface roughness and thus a decrease of the degree of wetting of the substrate surface by the interconnect layer. Accompanying the decrease of the degree of wetting the bond strength between the surfaces drops; this promotes mechanical removal and/or in the ideal case leads to spontaneous separation of the substrate stack. The surface roughness is specified either as the average roughness, quadratic roughness or as the averaged peak-to-valley height. The determined values for the average roughness, the quadratic roughness and the averaged peak-to-valley height generally differ for the same measured distance or measurement area, but are generally of the same order of magnitude. Therefore the following ranges of numerical values for the roughness should be understood either as values for the average roughness, the quadratic roughness or for the averaged peak-to-valley height. The roughness produced by the embodiments of the invention is in particular greater than 1 nm, preferably greater than 10 nm, still more preferably greater than 1 µm, most preferably greater than 10 µm, most preferably of all greater than 100 µm.

In particular the interconnect layer will be embrittled by the temperature drop. The embrittlement of the interconnect layer is caused alternatively or additionally by the following processes:
  cooling
  additive, in particular by
    softeners, preferably by
      heating and/or
      chemicals (solvents) and/or
      electrical current and/or
      irradiation,
    solvents preferably by
      heating and/or
      irradiation,
  hardening, in particular by irradiation, preferably UV irradiation.

Embrittlement is characterized especially by the decrease of the plastic deformability of the interconnect layer. A material which fractures in an ideally brittle manner is a material which fractures under applied mechanical load without deforming plastically beforehand. The brittle fracture property for the material (in particular plastic) used can be influenced in particular by additives.

The embodiments of the invention relate mainly to devices with which the temperature of the interconnect layer of a substrate stack can be effectively lowered to a temperature range suitable for embrittlement. Materials for the interconnect layer are preferred whose embrittlement takes place by a temperature drop. The interconnect layer embrittles in particular when a critical temperature range, in particular a critical temperature, is reached or undershot. The difference between a critical temperature range and a critical temperature is based on the brittle fracture generally taking place, not abruptly, but within an interval. In particular however an abrupt transition and/or brittle-ductile transition can take place which is then given with a critical temperature.

The critical temperature is in particular between 0° C. and −50° C., preferably between −25° C. and −75° C., still more preferably between −50° C. and −100° C., most preferably between −75° C. and −125° C. The critical temperature is in particular less than 0° C., preferably less than −50° C., still more preferably less than −100° C., most preferably less than −150° C. Values for the critical temperature should also be considered to be disclosed as values for a critical temperature range. The terms should in particular also encompass each other.

The embrittlement of the material which has been chosen can be reversible or (preferably irreversible. The embrittlement is reversible when it can be produced or neutralized by repeated cooling and active or passive heating. Here a material for the interconnect layer is chosen which can reversibly change between a ductile and brittle property. The embrittlement is reversible when it can no longer be neutralized.

Inasmuch as reversible embrittlement takes place, the detachment (debonding process) is carried out below the critical temperature.

Inasmuch as irreversible embrittlement takes place, the detachment (debonding process) is carried out in particular at room temperature and/or in a spatially separate area, preferably a debonder.

Embrittling Device (Embodiment of the Device According to the Invention)

An embrittling device is an embodiment of a system/device of the invention comprising at least of one cooling body, in particular a cooling plate with one, preferably single cooling area, and at least one feed line via which a cooling fluid is routed to the cooling body, especially to the cooling area. The cooling body is supplied with a cooling fluid, which in particular flows through it, and in this way the cooling performance is transferred to the substrate stack and thus to the interconnect layer which leads to cooling of the interconnect layer.

A cooling body is chosen whose specific heat capacity is as small as possible in order to minimize the storage of energy in the form of heat. The specific heat capacity of the cooling body, in particular on its cooling area, is between 0.0 kJ/(kg*K) and 20 kJ/(kg*K), preferably between 0.0 kJ/(kg*K) and 15 kJ/(kg*K), still more preferably between 0.0 kJ/(kg*K) and 10 kJ/(kg*K), most preferably between 0.0 kJ/(kg*K) and 5 kJ/(kg*K), most preferably of all between 0.0 kJ/(kg*K) and 1 kJ/(kg*K).

A cooling body is chosen whose thermal conductivity is as large as possible in order to ensure the prompt removal of heat. The thermal conductivity is preferably between 0.1 W/(m*K) and 5000 W/(m*K), preferably between 1 W/(m*K) and 2500 W/(m*K), still more preferably between 10 W/(m*K) and 1000 W/(m*K), most preferably between 100 W/(m*K) and 450 W/(m*K).

The cooling fluid according to one advantageous embodiment of the invention is routed via at least one feed line into or onto the cooling body of the embrittlement device. This embodiment can be developed by the cooling fluid being routed in at least one circuit (corresponding in particular to the number of feed lines) through the cooling body, in order to optimize heat removal. The cooling fluid preferably emerges again from the embrittlement device via a second drain line which differs from the feed line. The use of several feed and/or drain lines, in particular in combination with a mixture of different cooling fluids, would also be conceivable. Since the separation of these fluids after their mixing is not possible in the embodiment of the invention, preferably several feed lines but only one drain line are connected to the cooling body.

In another embodiment of the invention the cooling fluid is not routed exclusively through the cooling body, but emerges through openings on the bottom of the cooling body which touches especially the substrate stack in order to route the cooling fluid directly onto the surface of one of the two substrates of the substrate stack. This results in direct contact of the cooling fluid with the substrate of the substrate stack; this leads to better cooling of the substrate, and thus of the cement. This embodiment of the invention is suited mainly for liquified gases like helium or nitrogen which very promptly remove heat from the substrate in direct contact with the latter and in doing so pass preferably into the gaseous phase. The gases which have formed can then diffuse away from the substrate stack which is to be cooled.

In another embodiment of the invention, the cooling fluid is not routed in a circuit through the cooling body, but emerges from the cooling body solely through discharge openings. The heated cooling fluid escapes in particular into an empty space between the cooling body and the substrate. The discharge openings act in particular as valves, in the preferred use of compressed gases, as choke valves.

In another embodiment of the invention the cooling body is at least partially porous, preferably at least on one cooling surface which faces the substrate. Chambers and/or channels of the cooling body for accommodating and/or distributing the cooling fluid are parts of an independent tank and/or line system and they are made in particular of a nonporous, compact material. This tank is surrounded in particular at least partially, preferably at one discharge opening, by a porous body. Embedding the tank by a powder which is delivered into a mold and which is sintered in a sintering process would also be conceivable. This especially simplifies an in particular complete enclosure of the tank by a porous material. Preferably the material properties, in particular the specific heat capacities and/or the thermal conductivities of the tank and the porous body, are for the most part identical. The deviations of the indicated material properties are preferably less than 20%, preferably less than 10%, still more preferably less than 5%, most preferably less than 1%, most preferably of all less than 0.1%. The specific heat capacity of the tanks and/or of the porous body is as low as possible in order to prevent the storage of energy in the form of heat or to make it more difficult. The specific heat capacity is preferably between 0.1 kJ/(kg*K) and 20 kJ/(kg*K), preferably between 0.1 kJ/(kg*K) and 15 kJ/(kg*K), still more preferably between 0.1 kJ/(kg*K) and 10 kJ/(kg*K), most preferably between 0.1 kJ/(kg*K) and 5 kJ/(kg*K), most preferably of all between 0.1 kJ/(kg*K) and 1 kJ/(kg*K). The thermal conductivity of the tank and/or of the porous body is as great as possible in order to ensure the prompt removal of the heat. The thermal conductivity is preferably between 0.1 W/(m*K) and 5000 W/(m*K), preferably between 1 W/(m*K) and 2500 W/(m*K), still more preferably between 10 W/(m*K) and 1000 W/(m*K), most preferably between 100 W/(m*K) and 450 W/(m*K).

Discharge holes from the cooling body according to one advantageous embodiment of the invention are preferably arranged in a regular manner. But they can also be distributed at least partially irregularly.

According to another, in particular independent aspect of the invention, there is a wafer chuck which is provided with a fixing means which can be activated by lowering the temperature for accommodating and fixing a substrate stack. In particular a freezable liquid, preferably water, is used to spray the holding area of the wafer chuck. During an above described or a separate cooling process, the liquid, in particular the water, freezes the substrate stack tight to the wafer chuck. This accomplishes simple fixing of the substrate stack on the wafer chuck without being reliant on clamps, vacuum tracks, electrostatic and/or magnetic elements. This fixing can in particular increase the holding force between the wafer chuck and the substrate stack. This embodiment of the invention can therefore also be used in conjunction with other indicated fixing devices and is preferably suited for blanket and/or partial embrittlement.

According to one advantageous embodiment the substrate stack is fixed on an in particular perforated film in order to bring the liquid, especially water, easily to the substrate stack. The water freezes on the film and at those locations on the substrate which lie on the perforations.

Blanket Embrittling Device

In a first embodiment of the invention, the embrittlement takes place in a blanket manner at the same time. The simultaneous and blanket embrittlement takes place by the at least one-sided cooling of the substrate stack by a device which has a cooling area which is at least as large as the area of the substrate stack to be cooled and thus of the cement which is to be cooled.

In one special embodiment the embrittlement takes place in a blanket manner at the same time and on two sides. This causes cooling of the two sides of the substrate stack. The substrate stack is in particular symmetrically cooled.

The cooling area corresponds preferably approximately to the area of the cooling body. The effective cooling area is preferably slightly smaller, in particular when the feed lines and cooling chambers run within the cooling body. Blanket embrittling devices can be operated especially in the cocurrent flow principle or in the counterflow principle, the counterflow principle being preferred since it allows effective cooling.

Partial Embrittling Device

In a second embodiment of the invention the embrittlement takes place by at least one cooling body whose area is smaller than the area of the substrate stack to be cooled. The area of the cooling body is in particular smaller than 0.9 times, preferably smaller than 0.8 times, still more preferably smaller than 0.6 times, most preferably smaller than 0.4 times, most preferably of all smaller than 0.2 times the area of the substrate stack. The cooling body is moved relative to the substrate stack in order to ensure complete cooling and embrittlement of the entire interconnect layer. The relative motion takes place either by moving the cooling body relative to the static substrate stack, by moving the substrate stack relative to the static cooling body, or by moving the substrate stack and the cooling body.

In one preferred embodiment of the invention, the cooling body is static while the substrate stack is moved. This embodiment of the invention can solve several problems. First of all, it is not necessary to build and execute the lines for supply of the cooling fluid to be re-routable. In this way they can be made more compact since lines are made in particular to be able to expand and bend (other embodiment of the invention). Due to the low temperatures of the supplied cooling fluid the line material is chosen such that it has a tendency to brittle fracture as small as possible and in this way is accordingly resistant.

Peripheral Embrittling Device

In a third embodiment of the invention, the embrittlement takes place in an especially completely peripheral region (therefore along one lateral, ring-shaped outer contour) of the substrate stack. Preferably a clamping ring according to document WO2012/139627A1 is developed such that cooling of the clamping ring becomes possible. The clamping ring thus becomes the cooling body, the cooling being limited to the periphery of the substrate stack. The inventive idea of WO2012/139627A1 includes in particular in building a clamping ring as flexible and bendable as possible. In order not to lose these properties, the clamping ring can be built such that the cooling fluid does not flow through the clamping ring, but the latter is cooled from the outside. In this way the clamping ring need not be reconfigured in terms of construction technology and retains mainly its flexibility and pliability. The less efficient cooling of the clamping ring compared to a clamping ring through which cooling fluid flows (preferred embodiment) would be a disadvantage.

The clamping ring can also be used without cooling in order to separate an already embrittled substrate stack. In doing so in particular the mechanical properties are used, especially the flexible bending of the clamping ring in order to load the already embrittled substrate stack peripherally, in particular in one spot, with a force, especially a tensile force. The especially spot loading produces an especially locally concentrated force and thus a high tensile stress which leads mainly to failure by supercritical crack growth for materials which fracture in a brittle manner.

Embrittling Device as Debonding Wafer Chuck

All the aforementioned embodiments of the invention can preferably be built such that the cooling units, in particular the cooling bodies, are also made as wafer chucks, in particular as debonding wafer chucks or as a clamping ring.

Fixing of the substrate, in particular a substrate as part of a substrate stack, takes place via fixing elements. The fixing elements are mechanical clamps and/or vacuum tracks and/or
electrostatic fixing and/or
adhesive, especially switchable surface and/or
magnetic and/or
electrical fixing and/or
specially shaped, preferably static construction elements such as in particular the peripheral shoulder and the inner edge of a clamping ring according to document WO2012/139627A1.

Preferably mechanical clamps and/or vacuum tracks are used due to the strong thermal loading.

According to one advantageous embodiment of the invention the cooling body is provided with discharge openings and at the same time has means for fixing the substrate stack and exhausting the cooling liquid which emerges through the discharge openings.

For blanket fixing by means of a vacuum, especially preferably the embodiment of the invention of the blanket, a porous embrittling device is suitable since the cooling fluid can be exhausted directly via the porous cooling body. Thus, on the one hand the gases produced by the vaporization process are immediately exhausted and on the other hand a negative pressure, in particular a vacuum, is produced. The negative pressure generated is strong enough for in particular blanket fixing of a substrate.

In special embodiments the debonding process can be improved by applying ultrasound to the interconnect layer during and/or after the embrittlement. The interconnect layer which has been embrittled, especially cement, reacts especially sensitively to cyclic stresses. The frequency of the ultrasound is especially greater than 1 Hz, preferably greater than 100 Hz, still more preferably greater than 1 kHz, most preferably greater than 1 MHz, most preferably of all greater than 1 GHz. The ultrasound can act either on one area which is smaller, identical or larger than the area of the substrate stack. In particular, ultrasonic waves can be injected into a cooling fluid bath, preferably by the arrangement of an ultrasonic transmitter in the cooling fluid.

In one quite especially preferred embodiment one application of ultrasound to the embrittled cement is sufficient to effect a separation of the two substrates.

Embrittling Baths

In another embodiment of the invention the embrittlement of the substrate stack and thus of the cement is carried out in an embrittlement bath. An embrittlement bath is defined as an embodiment of the invention which includes at least a receiving tank, especially a tub, and the cooling fluid located in it. The cooling fluid is preferably liquid nitrogen or liquid helium. To prevent the cooling fluid from vaporizing prematurely by rapid absorption of heat, the receiving tank is preferably a Dewar vessel.

In another embodiment of the invention, there is a wafer chuck, in particular a platform, for accommodating the substrate stack within the receiving tank. The resting area of the wafer chuck is preferably directly underneath the highest points of the receiving tank wall. In one special embodiment there are loading devices within the wafer chuck to carry out a loading and/or unloading process. It is also conceivable for the wafer chuck itself to constitute in particular the movable loading device. The wafer chuck can then be moved out of the receiving tank in order to receive the substrate stack during a loading process or to prepare it again for unloading after a process.

In one especially preferred embodiment there are holding devices outside the receiving tank which fix the substrate stack or the frame with the film and substrate stack. Here lowering of the substrate stack to a cooling level is effected. By monitored control the complete immersion of the substrate stack can be omitted.

The described features apply analogously to the device of the invention and the method of the invention, as well as the application of the invention.

Other advantages, features and details of the invention will become apparent from the following description of preferred exemplary embodiments and using the drawings.

BRIEF DESCRIPTION OF THE DRAWINGS

FIG. 4 shows a schematic cross section of a fourth embodiment of the device according to the invention, not to scale, FIG. 5 shows a schematic cross section of a fifth embodiment of the device according to the invention, not to scale, FIG. 6 shows a schematic cross section of a sixth embodiment of the device according to the invention, not to scale, FIG. 7 shows a schematic cross section of a seventh embodiment of the device according to the invention, not to scale.

In the figures the same components or components with the same function are identified with the same reference numbers.

DETAILED DESCRIPTION OF THE INVENTION

Figure 1A:
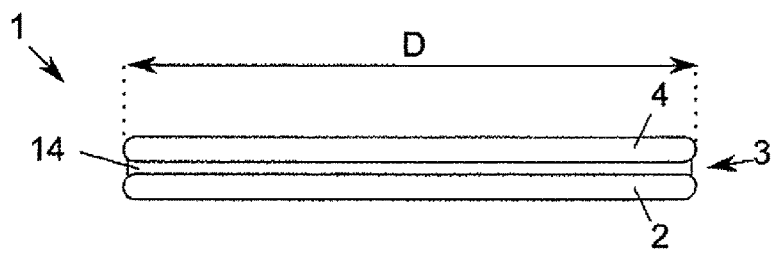
FIG. 1a shows a schematic cross section of a first embodiment of a substrate stack according to the invention with an interconnect layer, not to scale.

FIGS. 1a, 1b, 1c, 1d and 1e show substrate stacks 1, 1', 1'', $1^{IV}$ each comprised of a first substrate 2, 2' which is made as a product substrate, an interconnect layer 3, 3', 3'', 3''' which is made as cement, and a second substrate 4 which is made as a carrier substrate. The interconnect layer 3, 3', 3'', 3''' joins the first substrate 2, 2' to the second substrate 4. The substrates 2, 2', 4 have a diameter D.

The interconnect layer 3 in the first embodiment according to FIG. 1a is comprised of a single layer which is made as a single-component system or multicomponent system.

Figure 1B:
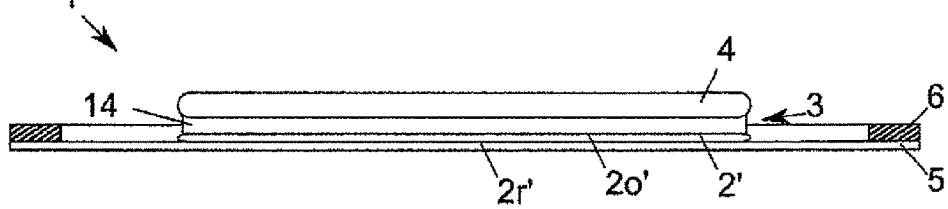
FIG. 1b shows a schematic cross section of a second embodiment of the substrate stack according to the invention located on a film, not to scale.

In the second embodiment according to FIG. 1b the substrate stack 1' has an in particular back-thinned product substrate 2' which has been fixed via its surface 2o' which has not been back-thinned by the interconnect layer 3 on the carrier substrate 4. One back-thinned side 2r' is fixed on a film, 5, in particular a dicing tape. The film 5 is clamped on a frame 6.

Figure 1C:
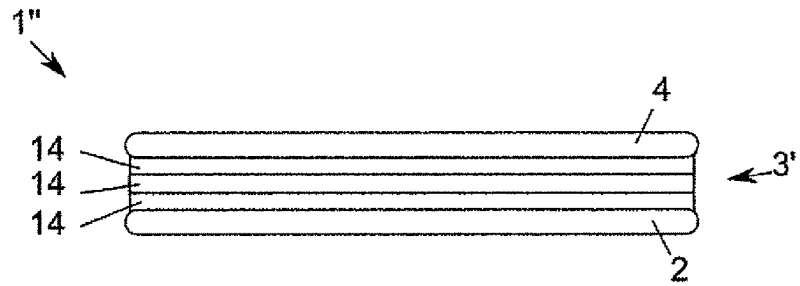
FIG. 1c shows a schematic cross section of a third embodiment of the substrate stack according to the invention with an interconnect layer comprised of several layers, not to scale.

The substrate stack 1'' according to FIG. 1c is comprised of the product substrate 2 which is fixed to the carrier substrate 4 via the interconnect layer 3' which comprises in particular several layers 14. Each of the layers 14 can be comprised of a single component or of several components. In particular not all the layers 14 need be adhesive layers.

Figure 1D:
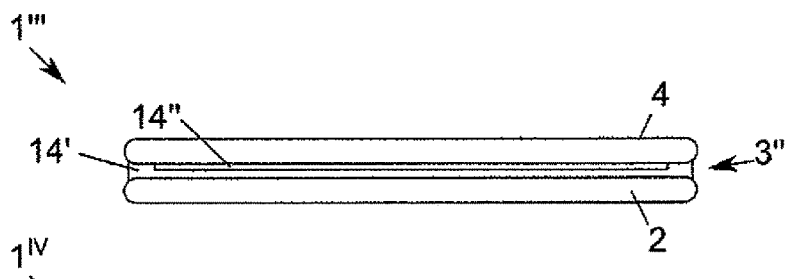
FIG. 1d shows a schematic cross section of a fourth embodiment of the substrate stack according to the invention, not to scale.

In the embodiment according to FIG. 1d the substrate stack 1''' is provided with an interconnect layer 3'' which is made as a ZoneBOND™ system. The interconnect layer 3'' has one adhesive layer 14'' which extends over the entire contact area between the two substrates 2, 4. One adhesion-reduced layer 14'' covers one of the surfaces of the interconnect layer 3'' so that the joining force acts at least predominantly, preferably essentially exclusively on an outer ring section which surrounds the adhesion-reduced layer 14''.

Figure 1E:
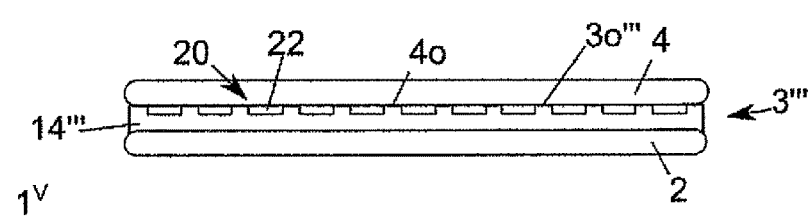
FIG. 1e shows a schematic cross section of a fifth embodiment of the substrate stack according to the invention with an interconnect layer which has a structured layer, not to scale.

In the embodiment according to FIG. 1e the substrate stack $1^{IV}$ is comprised of the product substrate 2 which is fixed to the carrier substrate 4 via the interconnect layer 3'''. The interconnect layer 3''' is formed from a structured layer 14'''. The embodiment of the invention calls for structuring the layer 14'''. The structuring forms cavities 20 in which a filler material 22 can be accommodated. The structuring takes place by a known process, in particular by imprint lithography or photolithography. The embodiment of the invention yields a patterned cement surface 3o''' which by one of the embrittlement processes causes a lowering of the adhesion force between the cement surface 3o''' and the carrier substrate surface 4o. In particular the filler material 22 which has been deposited in the cavities 20 reduces its volume by the temperature reduction such that the effective adhesive area between the cement 3, 3', 3'', 3''' and the carrier substrate 4 is reduced.

The structured layer 14''' according to one alternative embodiment can also be part of a multilayer system and therefore can be covered by another named layer 14.

Figure 1F:
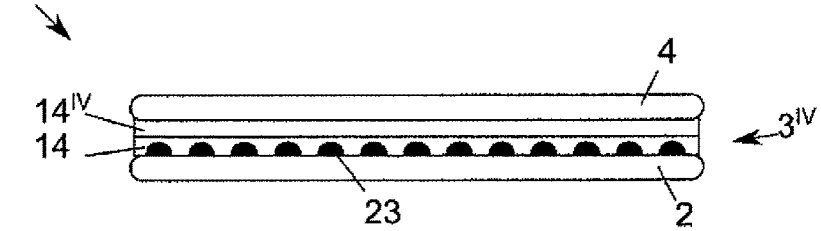
FIG. 1f shows a schematic cross section of a sixth embodiment of the substrate stack according to the invention with an interconnect layer comprised of a bond layer and a separating layer, not to scale.

In the embodiment according to FIG. 1f the substrate stack $1^V$ is comprised of the product substrate 2 with topographies, in particular bumps 23. The product substrate is fixed to the carrier substrate 4 via the interconnect layer $3^{IV}$. The interconnect layer $3^{IV}$ is comprised of a layer 14 of cement and a separating layer $14^{IV}$. The layer 14 of cement is used in particular to embed the topographies 23 of the product substrate 2.

Figure 2A:
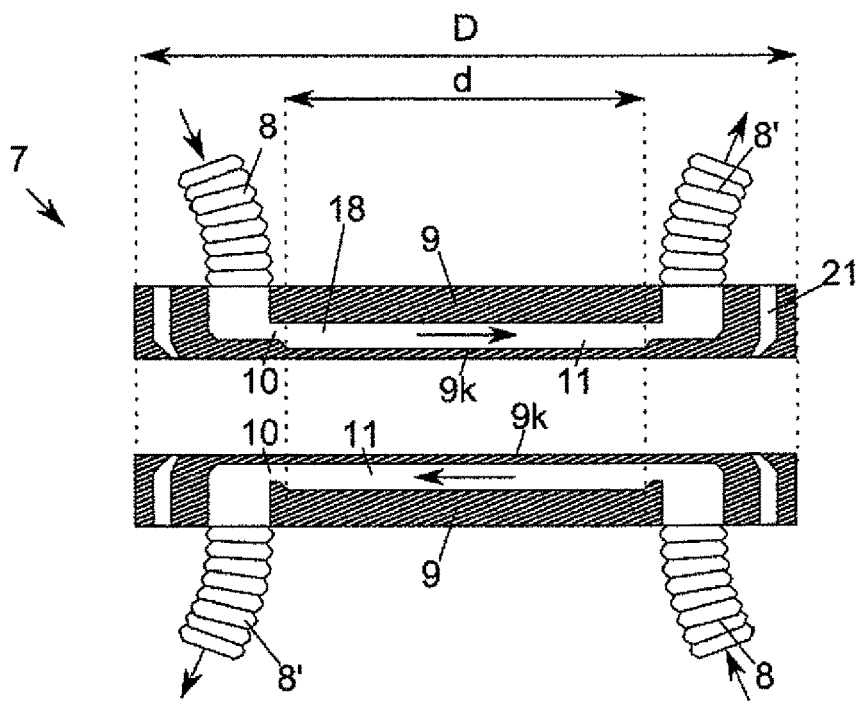
FIG. 2a shows a schematic cross section of a first embodiment of a device according to the invention in the counterflow principle, not to scale.

FIG. 2a shows a schematic cross section of a simplified first embodiment of a cooling unit 7, not to scale, which is operated in the counterflow principle. The cooling unit 7 is comprised of at least one, preferably exactly two, cooling bodies 9 with a cooling area 9k. The cooling bodies 9 have channels 10 and/or chambers 11 which are supplied with a cooling fluid 18, in particular a cooling liquid, still more preferably a cooling gas, via in particular re-routable lines 8, 8' which are made as feed and drain line. In order to ensure more efficient removal of the heat which has been absorbed by the cooling area 9k, the embodiment of the invention is preferably operated in counterflow. The two cooling fluids which are flowing through the channels 10 and/or chambers 11 of the cooling bodies 9 have anti-parallel or multidirectional flow vectors.

The substrates 2 and/or 4 can be fixed by the fixing elements 21, in particular vacuum tracks, on the cooling units 7, 7', 7" which are made preferably as wafer chucks. The fixing takes place before and/or during and/or after an embrittlement for debonding of the substrates 2, 4.

Figure 2B:
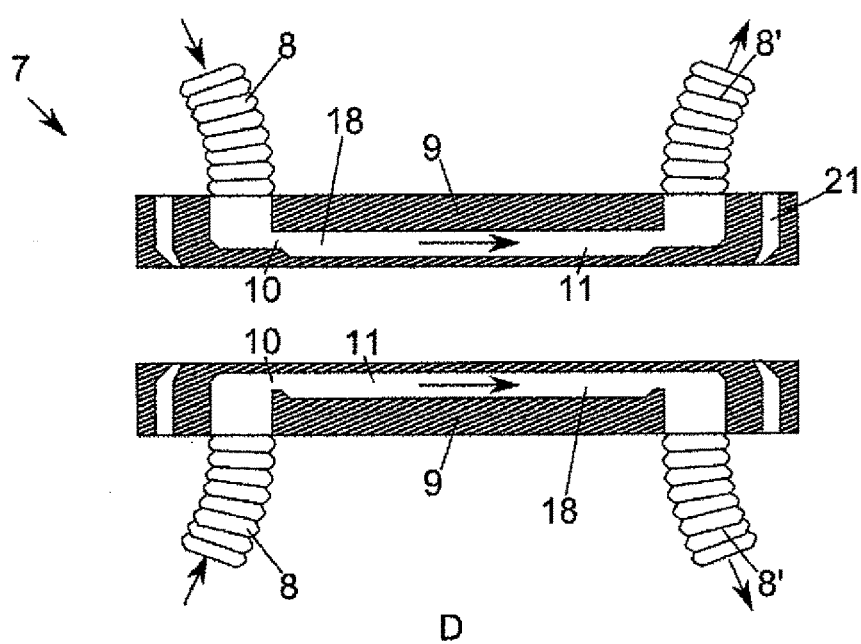
FIG. 2b shows a schematic cross section of a second embodiment of a device according to the invention in the cocurrent flow principle, not to scale.

In the embodiment according to FIG. 2b, the cooling units 7 operate in the cocurrent flow principle. The two cooling fluids 18 which are flowing through the channels 10 and/or chambers 11 of the cooling bodies 9 have parallel or unidirected flow vectors.

Figure 3:
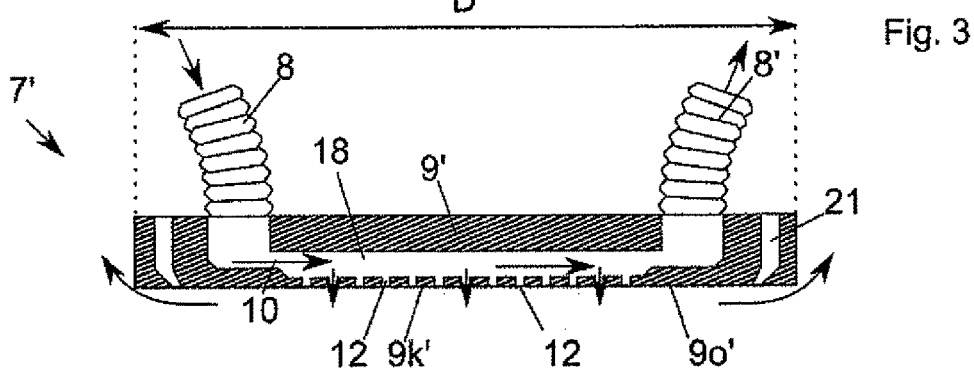
FIG. 3 shows a schematic cross section of a third embodiment of the device according to the invention, not to scale.

FIG. 3 shows a cooling unit 7' comprised of a cooling body 9', two lines 8, 8' which are made as a feed and drain line and which are used for supply and drainage, as well as several discharge openings 12 which are distributed along the cooling area 9k' and which allow a discharge of the cooling fluid 18 via a cooling body surface 9o' which is facing the substrate stack 1, 1', 1", 1''', 1$^{IV}$.

The cooling body 9' is cooled by the cooling fluid 18 which is flowing, in particular circulating in the channels 10 and/or the chambers 11. At the same time part of the cooling fluid 18 discharges from the openings 12 and leads to an additional, more intense cooling of the substrate stack 1, 1', 1", 1''', 1$^{IV}$. The discharged cooling fluid 18 which has been heated in particular by the substrate stack 1, 1', 1", 1''', 1$^{IV}$ and which has passed into the gaseous phase is removed along the cooling body surface 9o'.

For monitoring of the cooling process, according to one development of this invention a measurement of the amount of heat which has been absorbed by the cooling fluid 18 is taken by a temperature comparison measurement.

FIG. 4 shows a cooling unit 7" comprised of a cooling body 9", a line 8 which is made as a feed line and several discharge openings 12 which allow discharge of the cooling fluid 18 via the cooling body surface 9o".

The cooling body 9" is cooled by the cooling fluid 18 which is flowing in the channels 10 and/or the chambers 11. At the same time part of the cooling fluid 18 discharges from the discharge openings 12 and leads to an additional, more intense cooling of the substrate stack 1, 1', 1", 1''', 1$^{IV}$. The discharged cooling fluid 18 which has been heated in particular by the substrate stack 1, 1', 1", 1''', 1$^{IV}$ and which has passed into the gaseous phase is removed along the cooling body surface 9o".

In particular, the discharge rate and the discharge pressure of the cooling fluid 18 on the discharge openings 12 can be regulated by a control (by means of a control apparatus which is not shown and which is responsible for the control of the described processes and components and equipment) of the cooling fluid pressure.

The cooling body 9" is preferably made as a choke valve which is comprised of several discharge openings 12. Isenthalpic expansion of the cooling fluid 18 is preferred and thus further cooling of the gas can take place by a correspondingly precompressed cooling fluid 18 (if the cooling fluid 18 is in the correct temperature range and has a positive Joule-Thomson coefficient). The discharge openings 12 are used as choke valves, the cooling bodies 9" as insulation.

In one especially preferred embodiment clean air as the cooling fluid 18 from the vicinity is compressed by compressors to more than 20 bar, in particular more than 50 bar, still more preferably more than 100 bar, most preferably more than 150 bar, most preferably of all more than 200 bar. Temperature drops of several degrees Celsius are possible by isenthalpic expansion of the air to a pressure of less than 100 bar, in particular less than 50 bar, still more preferably less than 25 bar, most preferably less than 10 bar, most preferably of all less than 5 bar. In particular, this isenthalpic expansion yields a temperature drop of more than 5° C., in particular more than 10° C., still more preferably more than 25° C., most preferably more than 35° C., most preferably of all more than 45° C. These temperature drops can induce the embrittlement effect if the material of the interconnect layer is designed for the corresponding temperature range.

FIG. 5 shows a cooling unit 7''' comprised of a fixing element 21' which is made as a porous body and which on the one hand is used for fixing of the substrate stack 1, 1', 1", 1''', 1$^{IV}$, 1$^{V}$ by means of negative pressure and on the other for exhausting the cooling fluid 18 which has been discharged from the discharge openings. Furthermore the cooling unit 7''' has a tank 13 which is embedded in particular in the fixing element 21' and which comprises in particular of a nonporous and/or other type of material, with a feed line 8 and several discharge openings 12'.

The discharge openings 12' are outputs of the tank 13. One aspect of the invention includes the feed of a cooling fluid 18 via the feed line 8 into the tank 13 and discharge of the cooling fluid 18 from the discharge openings. Subsequently the exhaust of the cooling fluid 18 which has passed in particular into the gaseous aggregate state takes place via the porous cooling body 9'''. The cooling takes place in this preferred embodiment predominantly by the cooling fluid 18 which has been routed from the discharge openings 12' directly to the substrate stack.

This embodiment of the invention is thus suited in particular as a cooling wafer chuck which at the same time has a fixing possibility for debonding by the application of a vacuum via the porosity of the cooling body 9'''.

The porous body 21' according to one development of the invention is made laterally vacuum-tight by construction engineering measures. In particular the porous body 21' is inserted into a component (not shown) which surrounds the porous body so that there is no vacuum leak on the sides of the cooling body 9'''.

FIG. 6 shows a cooling unit 7$^{IV}$ which is comprised of a cooling body 9$^{IV}$, whose diameter D' or the diameter d' of its cooling area 9k" is smaller than the diameter D of at least one of the substrates 2, 2', 4. This measure makes available a cooling body 9$^{IV}$ with which sequential embrittlement of the interconnect layer 3, 3', 3", 3''' can take place by a relative movement to a substrate stack 1, 1', 1", 1''', 1$^{IV}$. This embodiment is advantageous for substrate stacks 1, 1', 1", 1''', 1$^{IV}$ whose interconnect layer 3, 3', 3", 3''' is bonded solely on parts of the contact surface between the substrates 2, 4, in particular on the outer periphery, while other sections are not connected or are connected only with low adhesion force.

These cooling bodies 7$^{IV}$ can advantageously be used for embrittlement of a ZoneBOND™ substrate stack according to FIG. 1d without unduly thermally loading the central region of the substrate stack 1'''.

FIG. 7 shows a cooling unit 7$^{V}$ which has an annular cooling body 9$^{V}$. The annular cooling body 9$^{V}$ constitutes an improvement of the invention in document WO2012/139627A1. The annular embodiment of the cooling body $9^V$ allows in particular fully peripheral cooling which is however limited to the outer periphery of a substrate stack $1'''$, and preferably simultaneous lifting (detachment) of the carrier substrate 4 after the embrittlement.

The cooling body $9^V$ has at least one line 8 which is made as a feed line and at least one line 8' which is located in particular opposite, and which is made as a drain line. Via an annular channel 10' the cooling fluid 18 is routed from the feed line into at least one chamber 11' to a cooling surface $9k'''$.

Figure 8:
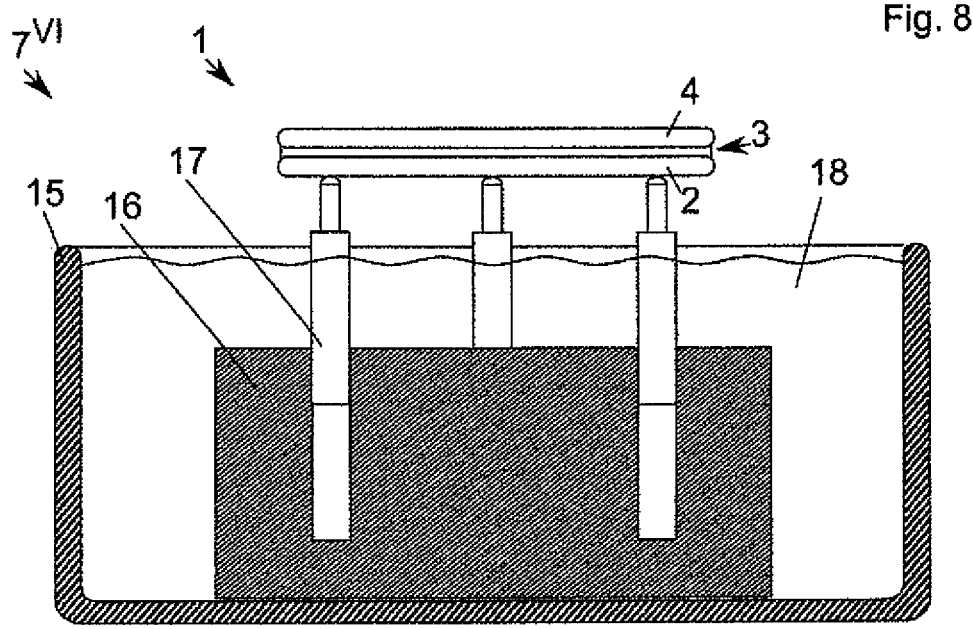
FIG. 8 shows a schematic cross section of an eighth embodiment of the device according to the invention, not to scale.

FIG. 8 shows a cooling unit $7^{VI}$ which has a receiving tank 15 in which the cooling fluid 18 is stored. Within the receiving tank 15 there is a wafer chuck 16 on which a substrate stack 1 can be deposited in order to be completely immersed in the cooling fluid 18. Preferably the wafer chuck 16 has loading units 17 for this purpose, with which loading and unloading of the substrate stack 1, 1', 1", 1''', $1^{IV}$ is enabled.

The loading units 17 are sealed by means of seals (not shown) against the wafer chuck 16.

Alternatively the wafer chuck 16 itself can be made as a movable loading unit.

This embodiment of the invention allows automated loading and unloading of the substrate stack 1, 1', 1", 1''', $1^{IV}$ by a robot. The control takes place via the control apparatus.

Figure 9:
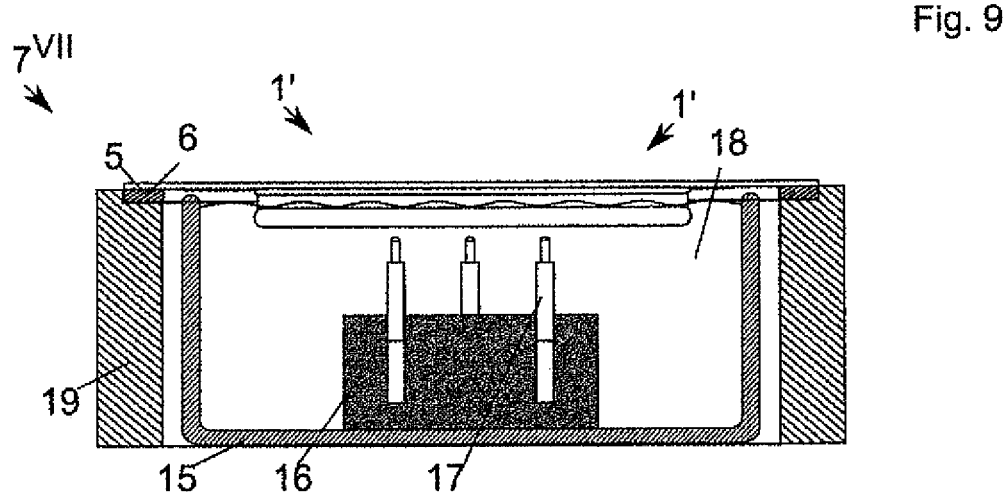
FIG. 9 shows a schematic cross section of a ninth embodiment of the device according to the invention, not to scale.

FIG. 9 shows a cooling unit $7^{VII}$ which in addition to the receiving tank 15 and the wafer chuck 16 has frame holder 19 which is located in particular outside the receiving tank 15. The substrate stack 1' which is fixed on a film 5 is immersed into the cooling fluid 18 while the frame 6 is fixed by the frame holder 19 which can in particular be moved and controlled separately.

The frame holder 19 can be located outside or inside the receiving tank 15. By taking the frame holder 19 into the receiving tank 15 the substrate stack 1' could be taken completely into the cooling fluid 18.

Figure 10:
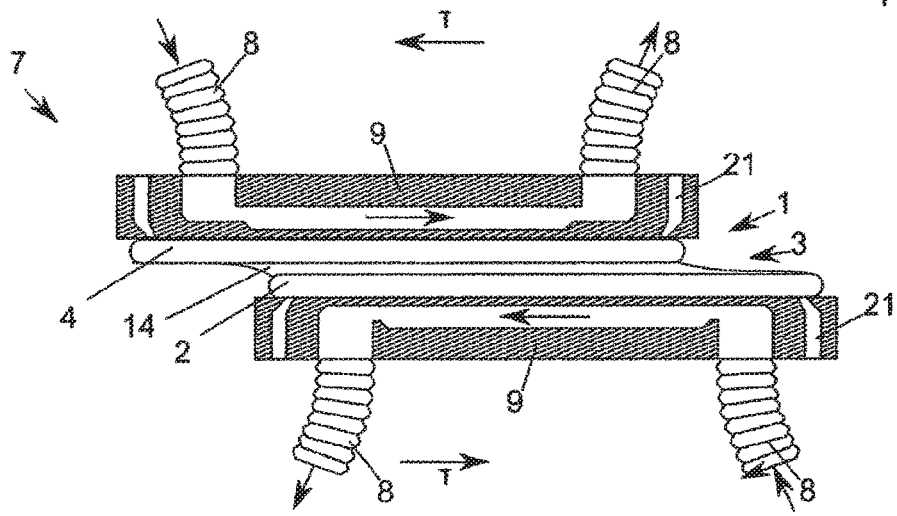
FIG. 10 shows a schematic cross section of a first embodiment of a debond process according to the invention, not to scale.

FIG. 10 shows a first debond process of the invention (detachment method) in which the cooling unit 7, 7', 7", 7''', $7^{IV}$ is used in the counterflow principle to cool the substrate stack 1, 1', 1", 1''', $1^{IV}$ and at the same time as a debonding wafer chuck. The two substrates 2 and 4 are each separated from one another by a cooling body 9 which is at the same time a debonder wafer chuck by a shear stress $\tau$.

The embrittlement of the interconnect layer 3, 3', 3", 3''' takes place briefly before (preferably) and/or during the debonding. The substrates 2 and 4 are fixed at least during detachment/debonding by the fixing elements 21, in particular vacuum tracks.

Figure 11:
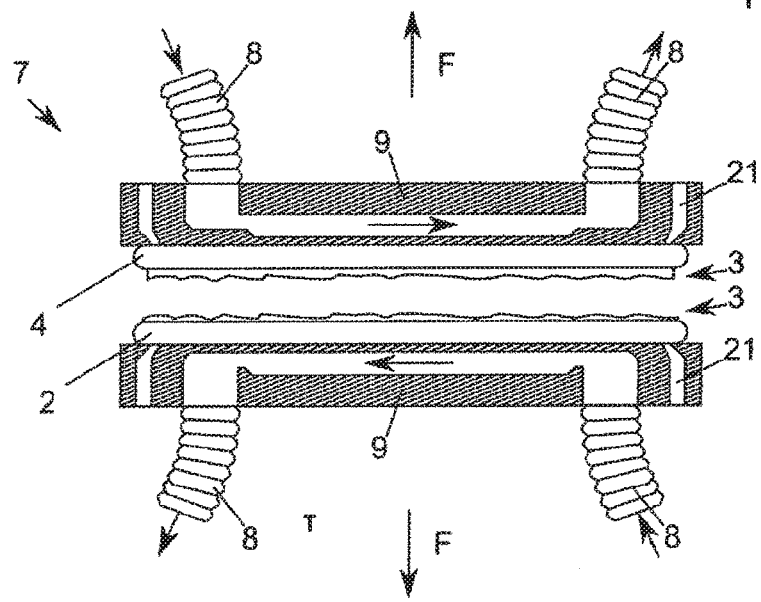
FIG. 11 shows a schematic cross section of a second embodiment of a debond process according to the invention, not to scale.

FIG. 11 shows a second debond process of the invention in which a cooling unit 7 is used in the counterflow principle to cool the substrate stack 1, 1', 1", 1''', $1^{IV}$ and at the same time as a debonder wafer chuck. The two substrates 2 and 4 are each separated from one another by a tensile stress F by one cooling body 9 at a time which is at the same time a debonder wafer chuck. The embrittlement of the cement 3, 3', 3", 3''' takes place briefly before (preferably) and/or during the debonding. The substrates 2 and 4 are fixed by the fixing elements 21, in particular vacuum tracks.

By the embodiment of the invention it could be possible for the first time to separate a substrate stack 1, whose substrates 2 and 4 are blanket-bonded to one another by a cement 3, 3', 3", 3''', from one another by a normal force on the entire contact surface of the substrates 2, 4 at the same time, in particular without deformation of the substrates 2, 4.

Figure 12:
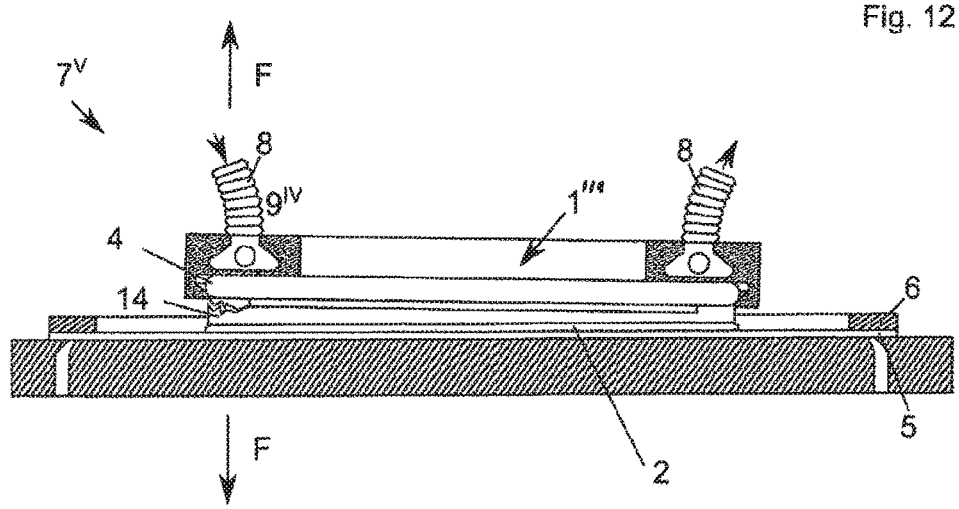
FIG. 12 shows a schematic cross section of a third embodiment of a debond process according to the invention, not to scale.

FIG. 12 shows a third debond process of the invention in which the cooling unit $7^V$ is used for cooling the periphery of the substrate stack 1''' and at the same time as a clamping ring for the carrier substrate.

The two substrates 2 and 4 are separated from one another by a tensile stress F which has been applied to the periphery, in particular over the entire periphery and which leads to bending of the carrier substrate 4. The embrittlement of the cement 3, 3', 3", 3''' takes place shortly before and/or during the debonding. The product substrate is fixed via the film 5 on a lower wafer chuck 16 which preferably has fixing elements 21.

REFERENCE NUMBER LIST 1, 1', 1", 1''', $1^{IV}$, $1^V$ substrate stack
2, 2' product substrate
2o' product substrate surface
2r' back-thinned product substrate surface
3, 3', 3", 3''', $3^{IV}$ interconnect layer, in particular cement
3o''', cement surface
4 carrier substrate
4o carrier substrate surface
5 film
6 frame
7, 7', 7", 7''', $7^{IV}$, $7^V$, $7^{VI}$ cooling unit
8, 8' lines
9, 9', 9", 9''', $9^{IV}$, $9^V$ cooling body, in particular cooling plate
9o', 9o" cooling body surface
9, 9k', 9k", 9k''' cooling area
10 channel
11 chamber
12, 12' opening
13 tank
14, 14', 14", 14''', $14^{IV}$ layer
15 receiving tank
16 wafer chuck
17 loading units
18 cooling fluid
19 frame holder
20 cavity
21, 21' fixing elements, in particular vacuum tracks
22 filler material
23 topography
D, D' diameter
d, d' diameter effective cooling area
F normal force
$\tau$ shear force Having described the invention, the following is claimed:

1. A method for detaching a pair of substrates from each other, said method comprising:

providing a first substrate and a second substrate that is temporarily bonded to the first substrate by an interconnect layer to form a substrate stack, said interconnect layer having a first side connected to the first substrate and a second side connected to the second substrate, wherein the interconnect layer is comprised of a plurality of layers including at least one adhesive layer and at least one separation layer;

holding the first substrate to a holding area of a first wafer chuck, said first wafer chuck including a cooling body having a cooling area and a fixing means to fix the first substrate to the holding area;

activating the fixing means to fix the first substrate to the holding area of the first wafer chuck;

cooling the interconnect layer to a temperature that is at or below a critical temperature for embrittlement of the at least one separation layer, thereby forming cracks in the at least one separation layer, said critical temperature being at or below 0° C., wherein the cooling of the interconnect layer includes flowing of a cooling fluid through the cooling area of the cooling body of the first wafer chuck and wherein the cooling of the interconnect layer forms cracks through only a portion of the at least one separation layer in a partial embrittlement; and detaching the first substrate from the second substrate.

2. The method as claimed in claim 1, wherein the critical temperature is below −100° C.

3. The method as claimed in claim 1, wherein the interconnect layer is comprised of: a silicone, and/or a plastic, and/or wax.

4. The method as claimed in claim 3, wherein the interconnect layer further comprises: organic components and/or inorganic components and/or metals and/or metal ions and/or metal alloys and/or ceramics.

5. The method as claimed in claim 4, wherein the inorganic components are inorganic molecules.

6. The method as claimed in claim 1, wherein the interconnect layer is comprised of a plastic selected from the group consisting of: a thermoplastic, a duroplastic, and an elastomer.

7. The method as claimed in claim 1, wherein at least one layer of the interconnect layer is comprised of organic molecules.

8. The method as claimed in claim 1, wherein said cooling body of the first wafer chuck has a thermal conductivity between 0.1 W/(m*K) and 5000 W/(m*K).

9. The method as claimed in claim 1, wherein the method further comprises:

holding the second substrate to a holding area of a second wafer chuck, said second wafer chuck including a cooling body having a cooling area through which a cooling fluid flows to cool the interconnect layer to the temperature that is at or below the critical temperature for embrittlement of the at least one separation layer.

10. The method as claimed in claim 9, wherein the interconnect layer is cooled from both sides of the substrate stack to symmetrically cool the interconnect layer.

11. The method as claimed in claim 9, wherein a flow direction is the same for the cooling fluid flowing through the cooling area of the first wafer chuck and the cooling fluid flowing through the cooling area of the second wafer chuck.

12. The method as claimed in claim 9, wherein a flow direction is the opposite for the cooling fluid flowing through the cooling area of the first wafer chuck and the cooling fluid flowing through the cooling area of the second wafer chuck.

13. The method as claimed in claim 1, wherein the method further comprises:

exposing the interconnect layer to ultrasound during and/or after cooling of the interconnect layer and/or embrittlement of the at least one separation layer of the interconnect layer.

14. The method as claimed in claim 1, wherein the interconnect layer is cooled from one side of the substrate stack.

15. The method as claimed in claim 1, wherein the critical temperature is in a range between 0° C. and −150° C.

* * * * *